United States Patent [19]

Awano

[11] Patent Number: 4,963,948
[45] Date of Patent: Oct. 16, 1990

[54] SEMICONDUCTOR DEVICE HAVING LEVEL SHIFT DIODE

[75] Inventor: Yuji Awano, Tokyo, Japan

[73] Assignee: Fujitsu Limited, Kanagawa, Japan

[21] Appl. No.: 398,281

[22] Filed: Aug. 22, 1989

Related U.S. Application Data

[63] Continuation of Ser. No. 134,862, Dec. 18, 1987, abandoned.

[30] Foreign Application Priority Data

Dec. 20, 1986 [JP] Japan ................... 61-302866

[51] Int. Cl.$^5$ ............................. H01L 29/161
[52] U.S. Cl. ....................... 357/16; 357/58; 357/22; 357/41
[58] Field of Search ............... 357/16, 22 A, 22 MD, 357/58, 90, 41, 15, 15 M, 15 P, 13, 40

[56] References Cited

U.S. PATENT DOCUMENTS

| | | | |
|---|---|---|---|
| 4,424,525 | 1/1984 | Mimura | 357/22 A X |
| 4,575,924 | 3/1986 | Reed et al. | 357/22 A X |
| 4,739,379 | 4/1988 | Akagi et al. | 357/16 |

FOREIGN PATENT DOCUMENTS

| | | | |
|---|---|---|---|
| 58-170054 | 10/1983 | Japan | 357/30 PF |
| 60-95973 | 5/1985 | Japan | 357/22 MD |
| 61-274369 | 12/1986 | Japan | 357/22 MD |

OTHER PUBLICATIONS

Tomizawa et al., "Monte Carlo Simulation of GaAs Submicron N+-N-N+ Diode With GaA/As Heterojunction Cathode," *Electronic Letters*, 9 Dec. 1982, No. 25/26, vol. 18, pp. 1067–1069.

Esaki et al., "Novel Epitaxy", *IBM Technical Disclosure Bulletin*, vol. 16, No. 4, Sep. 1973, p. 1231.

Dupuis et al., "Stacked Multiple-Bandgap Solar Cells Prepared by CVD Techniques", Conf., 14th *IEEE Photovoltaic Specialists Conf.* 1980, (7–15 Jan. 1980), pp. 1388–1390.

Konagai et al., "Graded-Band-Gap pGa$_{1-x}$Al$_x$As-N-GaAs Heterojunction Solar Cells", *Journal of Applied Physics*, vol. 46, No. 8, Aug. 1978, 3542-6.

*Primary Examiner*—William Mintel
*Attorney, Agent, or Firm*—Staas & Halsey

[57] ABSTRACT

A semiconductor device comprises a substrate, at least one field effect transistor provided on the substrate, and at least one level shift diode provided on the substrate, where the level shift diode comprises a first layer made of a first compound semiconductor and a second layer made of a second compound semiconductor having an electron affinity smaller than that of the first compound semiconductor. The first and second layers form a heterojunction therebetween. The first and second compound semiconductors are both made of either one of n-type and i-type (or either one of p-type and i-type) semiconductors, and the first layer is used in common with the field effect transistor as a layer of the field effect transistor.

14 Claims, 10 Drawing Sheets

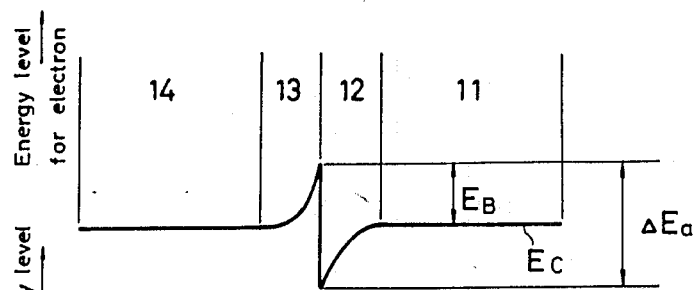
FIG. 2A
$Va = 0$
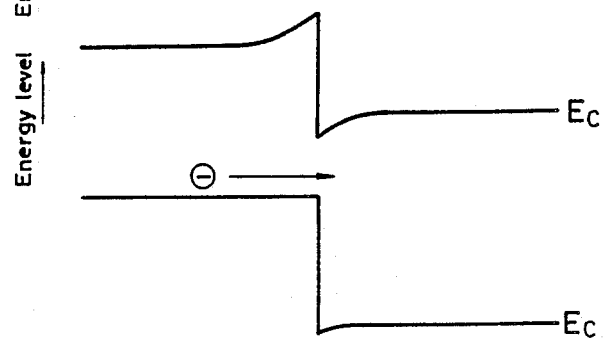
FIG. 2B
$Va \leq \Delta Ea/e$
FIG. 2C
$Va \approx \Delta Ea/e$
FIG. 2D
$Va \approx \Delta E/e$
barrier
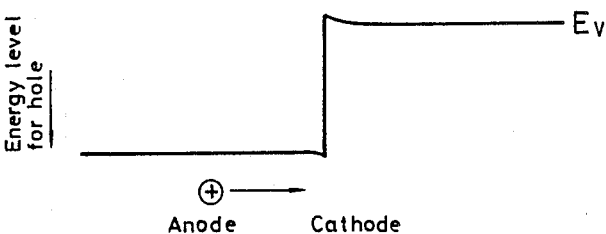
FIG. 3
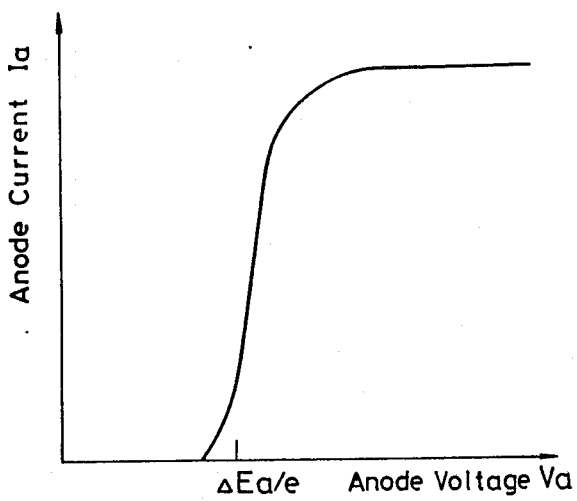

Va=0

Va=2Ea/e

SEMICONDUCTOR DEVICE HAVING LEVEL SHIFT DIODE

This is a continuation of co-pending application Ser. No. 134,862, filed on Dec. 18, 1987, now abandoned.

BACKGROUND OF THE INVENTION

The present invention generally relates to semiconductor devices having level shift diodes, and more particularly to a semiconductor device having at least one level shift diode with an arbitrary level shift quantity by utilizing a discontinuity in the energy band at a heterojunction between two semiconductors.

Conventionally, in a semiconductor device based on a silicon layer, a level shift diode is constructed by utilizing the fact that a forward voltage drop is approximately constant at a pn junction. The level shift diode is used to shift a voltage level by a predetermined value in a logic circuit and the like employing transistors. When a voltage drop introduced by one pn junction is insufficient, a plurality of level shift diodes are connected in series to provide the required voltage drop.

In a semiconductor device based on a gallium arsenide (GaAs) layer, a level shift quantity of a level shift diode utilizing a Schottky junction is a constant value which is approximately in a range of 0.6 V to 0.8 V per Schottky junction. The Schottky barrier height is in the range of 0.6 V to 0.8 V regardless of the kind of metal formed on the GaAs layer. Hence, even when a plurality of Schottky junctions are utilized, it is possible to obtain only a level shift quantity which is an integral multiple of the constant value. When making a Schottky diode, the Schottky junction is made by forming a metal layer on the GaAs substrate. But the surface of the GaAs substrate is exposed to the air when forming the metal layer thereon. The surface of the GaAs substrate includes irregularities when compared to that of the silicon substrate, and for this reason, it is difficult to accurately control the level shift quantity of the Schottky diode because the Schottky diode is easily affected by a leakage current. In addition, since it is necessary to utilize a plurality of Schottky junctions in order to obtain a relatively large level shift quantity, a large area of the semiconductor device is occupied by the Schottky diodes for providing the desired level shift.

Therefore, there is a demand for a semiconductor device which has one or more level shift diodes with arbitrary level shift quantities, and in which the level shift diodes only occupy a small area on the semiconductor device. Needless to say, it is essential that the level shift quantity of each level shift diode on the semiconductor device is accurately controlled to a desired value.

On the other hand, "MONTE CARLO SIMULATION OF GaAs SUBMICRON n+-n-n+ DIODE WITH GaAlAs HETEROJUNCTION CATHODE" by K. Tomizawa, Y. Awano and N. Hashizume, ELECTRONIC LETTERS, Dec. 9, 1982 Vol. 18, No. 25/26 shows a current density versus anode voltage characteristics of a GaAs diode having a $Al_xGa_{1-x}As$ heterojunction cathode for different Al contents x.

SUMMARY OF THE INVENTION

Accordingly it is a general object of the present invention to provide a novel and useful semiconductor device having a level shift diode, in which the problems described above are eliminated and the demands are satisfied.

Another and more specific object of the present invention is to provide a semiconductor device having a level shift diode which comprises on an anode side thereof, a first compound semiconductor heterojunction forming layer and on a cathode side thereof, a second compound semiconductor heterojunction forming layer having an electron affinity smaller than that of the first compound semiconductor heterojunction forming layer. According to the semiconductor device of the present invention, it is possible to arbitrarily set the level shift quantity by stacking a plurality of heterojunctions and by appropriately changing the composition of the compound semiconductor heterojunction forming layer constituting the heterojunction which generates a discontinuity in the energy band. In addition, the area of the level shift diode on the semiconductor device is small compared to that of a Schottky diode.

Still another object of the present invention is to provide a semiconductor device comprising a substrate, at least one field effect transistor provided on the substrate, and at least one level shift diode provided on the substrate, where the level shift diode comprises a first layer made of a first compound semiconductor and a second layer made of a second compound semiconductor having an electron affinity smaller than that of the first compound semiconductor. The first and second layers form a heterojunction therebetween. The first and second compound semiconductors are both made of either one of n-type and i-type (or either one of p-type and i-type) semiconductors, and the first layer is used in common with the field effect transistor as a layer of the field effect transistor. In the case that the first and second compound semiconductors are both made of either p-type or i-type semiconductors, since the carrier of the level shift diode is a hole, the first layer, as the anode, is made of a first compound semiconductor having a carrier energy level at the bottom of the valence band but higher than that of the second compound semiconductor for the second layer as the cathode. According to the semiconductor device of the present invention, it is possible to accurately control the level shift quantity of the level shift diode.

Other objects and further features of the present invention will be apparent from the following detailed description when read in conjunction with the accompanying drawings.

BRIEF DESCRIPTION OF THE DRAWINGS

FIGS. 2A through 2C are energy band diagrams for explaining the operation of the level shift diode shown in FIG. 1A;

FIG. 2D is an energy band diagram for explaining the operation of the level shift diode shown in FIG. 1C;

FIG. 3 shows an anode voltage versus anode current characteristic of the level shift diode shown in FIG. 1A;

DETAILED DESCRIPTION

Figure 1A:
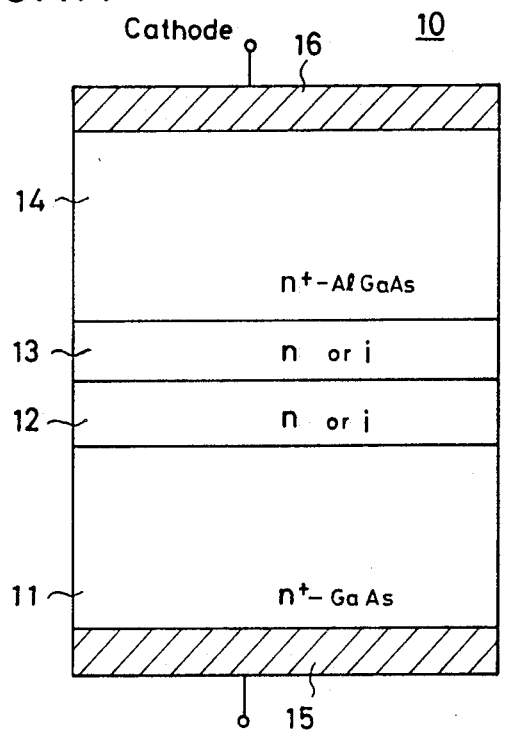
FIGS. 1A and 1C are cross sectional views each showing an embodiment of a level shift diode which constitutes an essential part of the semiconductor device according to the present invention.

FIG. 1A shows an embodiment of the level shift diode which constitutes an essential part of the semiconductor device according to the present invention. A level shift diode 10 comprises an n+-type gallium arsenide (GaAs) anode contact layer 11, an n-type GaAs heterojunction forming layer 12, an n-type (or i-type) aluminum gallium arsenide (AlGaAs) heterojunction forming layer 13, an n+-type AlGaAs cathode contact layer 14, an anode electrode 15, and a cathode electrode 16.

Figure 1B:
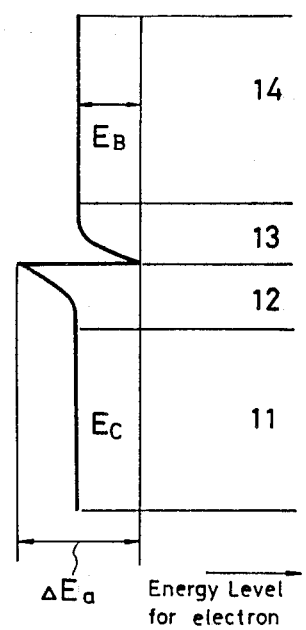
FIGS. 1B and 1D are energy band diagrams of the level shift diode shown in FIGS. 1A and 1C, respectively.

FIG. 1B shows an energy band diagram of the level shift diode 10. In FIG. 1B, $E_c$ denotes the bottom of the conduction band, and $\Delta E_a$ denotes the barrier height at the energy band gap produced by the difference in the electron affinities of the n-type GaAs heterojunction forming layer 12 and the n-type AlGaAs heterojunction forming layer 13. According to the level shift diode 10, a barrier height $E_B$ becomes small and a current starts to flow when a positive voltage is applied to the anode electrode 15, a negative voltage is applied to the cathode electrode 16 and the two voltages are increased.

FIGS. 2A through 2C show the energy band diagram of the level shift diode 10 for different anode voltages $V_a$, and FIG. 3 shows the anode volta $V_a$ versus anode current $I_a$ characteristic of the level shift diode 10. In FIGS. 2A through 2C and 3, those parts which are the same as those corresponding parts in FIGS. 1A and 1B are designated by the same reference numerals and characters.

FIG. 2A shows the energy band diagram for the case where $V_a=0$. In this case, the barrier height $\Delta E_a$ is sufficiently high, and no anode current $I_a$ flows.

FIG. 2B shows the energy band diagram for the case where $V_a \leq \Delta E_a/e$, where e denotes the electronic charge. In this case, the barrier height $\Delta E_a$ decreases compared to the case shown in FIG. 2A, and a slight anode current $I_a$ starts to flow.

FIG. 2C shows the energy band diagram for the case where $V_a \cong \Delta E_a/e$. In this case, the barrier height $\Delta E_a$ decreases even further from the case shown in FIG. 2B, and a large anode current $I_a$ flows thereby reaching a saturation.

Accordingly, in the level shift diode 10, the level (voltage) shift quantity changes depending on the barrier height $\Delta E_a$ at the heterojunction interface. But the barrier height $\Delta E_a$ can be varied by changing the composition of the n-type AlGaAs heterojunction forming layer 13 which is one of the semiconductor layers for forming the heterojunction interface, that is, by varying Al content x of $Al_xGa_{1-x}As$ which constitutes the n-type AlGaAs heterojunction forming layer 13. As a result, unlike the Schottky diode utilizing a Schottky junction where the level shift quantity can only be changed in steps, the level shift quantity of the level shift diode 10 can be changed continuously by appropriately varying the Al content x of $Al_xGa_{1-x}As$. Furthermore, it is possible to more accurately control the level shift quantity compared to the Schottky diode.

Figure 1C:
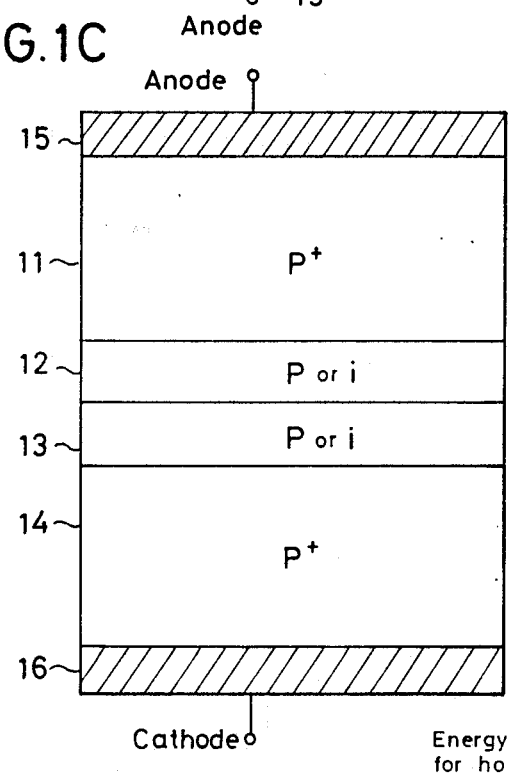
Figure 1D:
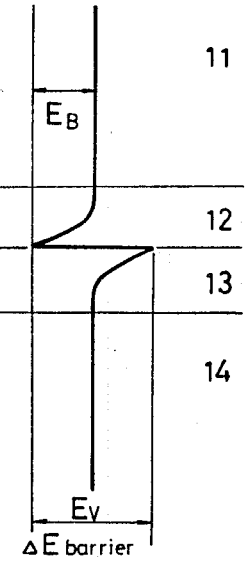

FIG. 1C shows a level shift diode with p-type semiconductors in which the carriers are holes. FIG. 1D is an energy band diagram of the level shift diode in FIG. 1C. $E_v$ denotes the bottom of the valence band, and $E_{barrier}$ denotes the barrier height at the energy band gap produced by the difference in the energy level of the valence band for the holes. In this case, the energy level of $E_v$ in the first layer 12 is higher than that of the second layer 13 at the heterojunction.

FIG. 2D shows the energy band diagram for the case where $V_a \cong \Delta E_{barrier}/e$. In this case, holes are injected from the anode to the cathode.

Figure 4A:
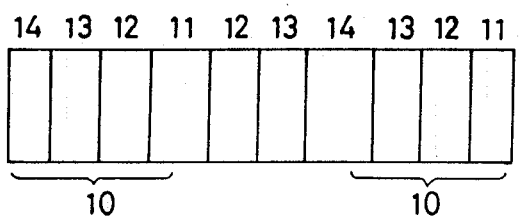
FIG. 4A is a cross sectional view showing another embodiment of the level shift diode which constitutes an essential part of the semiconductor device according to the present invention.

FIG. 4A shows another embodiment of the level shift diode which constitutes an essential part of the semiconductor device according to the present invention. In FIG. 4A, those parts which are the same as those corresponding parts in FIG. 1A are designated by the same reference numerals, and a description thereof will be omitted. In FIG. 4A, a level shift diode 20 essentially comprises two level shift diodes 10 which are connected in series.

Figure 4B:
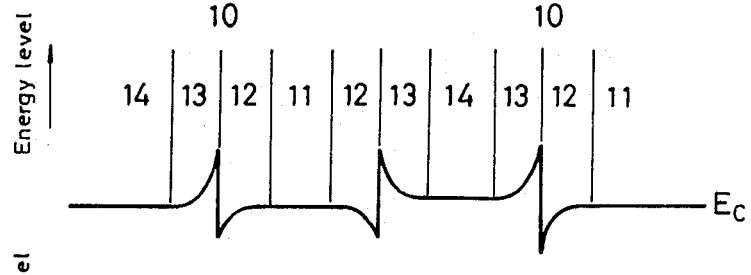
FIGS. 4B and 4C are energy band diagrams for explaining the operation of the level shift diode shown in FIG. 4A.
Figure 4C:
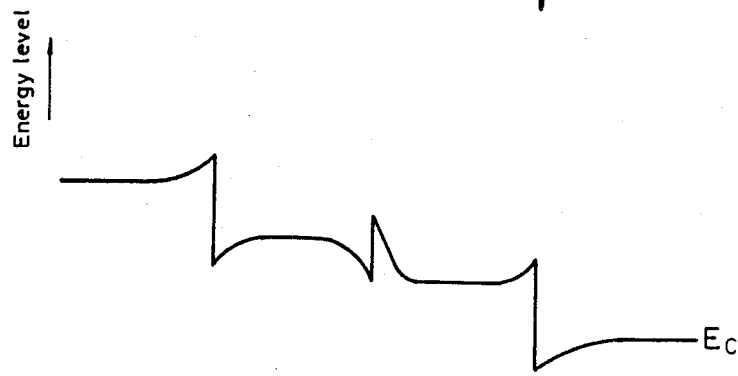
Figure 5:
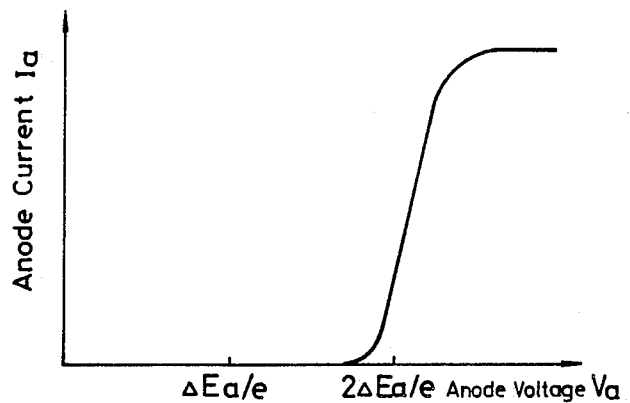
FIG. 5 shows an anode voltage versus anode current characteristic of the level shift diode shown in FIG. 4A.

FIG. 4B shows the energy band diagram of the level shift diode 20 for the case where $V_a=0$, and FIG. 4C shows the energy band diagram of the level shift diode 20 for the case where $V_a=2\times\Delta E_a/e$. In addition, FIG. 5 shows an anode voltage $V_a$ versus anode current $I_a$ characteristic of the level shift diode 20. In FIGS. 4A through 4C and 5, those parts which are the same as those corresponding parts in FIGS. 1A and 1B are designated by the same reference numerals and characters.

Because two level shift diodes 10 are essentially connected in series as shown in FIG. 4A, a diode coupled in an opposite direction is introduced in the middle between the two level shift diodes 10. However, the heterojunction in the middle essentially does not act as a barrier as may be seen from FIG. 4C. As a result, the level (voltage) shift quantity is $2\times\Delta E_a/e$ as shown in FIG. 5.

It is assumed heretofore that the two level shift diodes 10 constituting the level shift diode 20 are identical both in construction and characteristic. However, the two level shift diodes 10 may have the same construction but different barrier heights $\Delta E_a$. In other words, the Al content x of the $Al_xGa_{l-x}As$ which constitutes the n-type AlGaAs heterojunction forming layer 13 of one of the two level shift diodes 10 may be different from that of the other of the two level shift diodes 10. In this case, it is easier to control the level (voltage) shift quantity of the level shift diode 20 to a desired value than simply controlling to the same value the Al content x of the $Al_xGa_{l-x}As$ which constitutes the n-type AlGaAs heterojunction forming layer 13 of the two level shift diodes 10 having identical construction and characteristic.

Figure 4D:
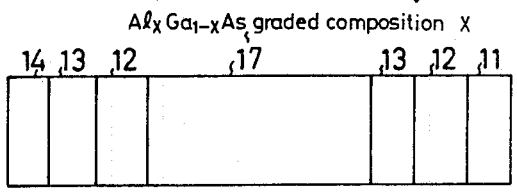
FIG. 4D is a cross sectional view showing another embodiment of the level shift diode which constitutes an essential part of the semiconductor device according to the present invention.
Figure 4E:
FIG. 4E is an energy band diagram of the level shift diode shown in FIG. 4D.
Figure 4F:
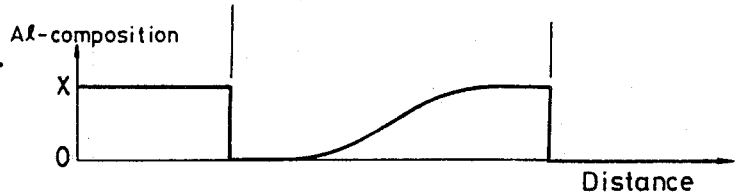
FIG. 4F is a graph of the aluminum composition of the level shift diode shown in FIG. 4D.

FIG. 4D shows the level shift diode which has a $Al_xGa_{l-x}As$ layer 17 with graded composition x in substitute of the layers 11 through 14 in FIG. 4A. FIG. 4E shows the energy band diagram of the level shift diode of FIG. 4D in which the energy level of the conduction band in the layer 17 changes gradually. FIG. 4F shows the Al composition of FIGS. 4D and 4E.

Figure 6:
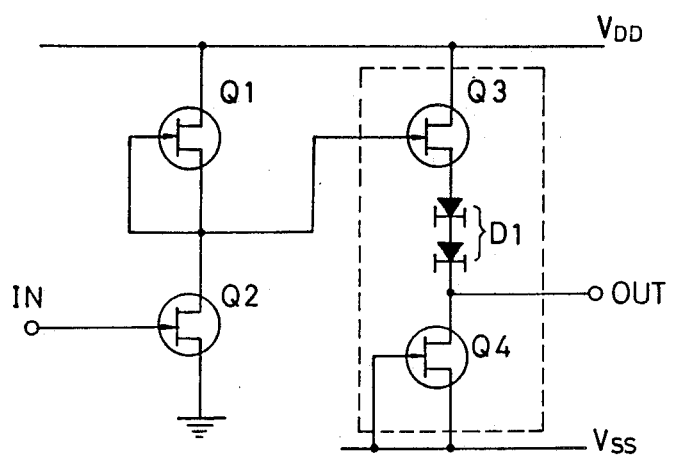
FIG. 6 is a circuit diagram showing a first embodiment of the semiconductor device according to the present invention.

Next, a description will be given on a first embodiment of the semiconductor device according to the present invention. FIG. 6 is a circuit diagram of the first embodiment. In FIG. 6, the semiconductor device is a buffered field effect transistor logic (BFL) circuit comprising transistors Q1 through Q4 and a level shift diode D1. IN and OUT respectively denote input and output terminals, $V_{DD}$ denotes a positive power source voltage, and $V_{SS}$ denotes a negative power source voltage.

Figure 7:
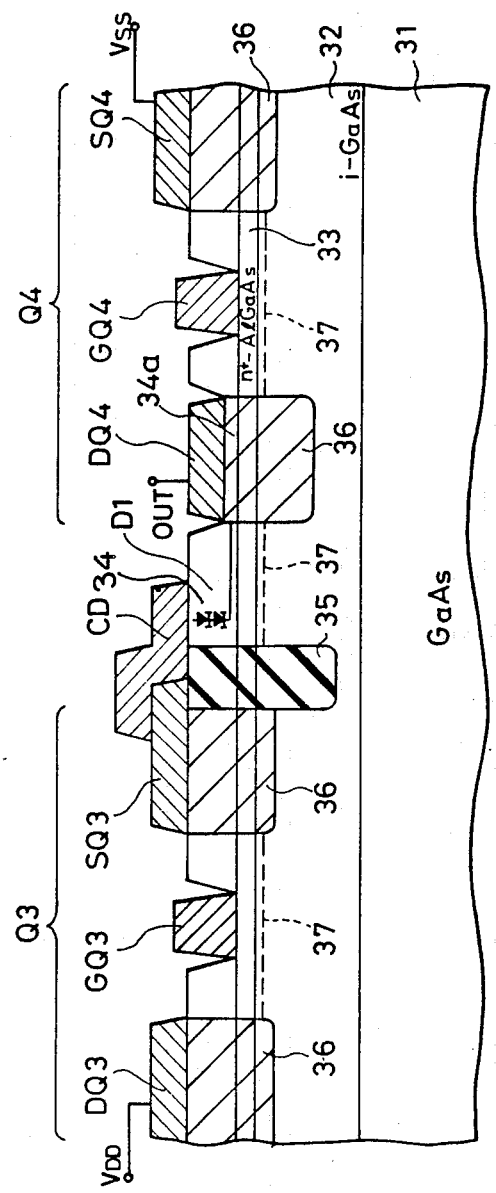
FIG. 7 is a cross sectional view showing an essential part of the first embodiment.

FIG. 7 shows an essential part of the first embodiment indicated by a phantom line in FIG. 6. In FIG. 7, those parts which are the same as those corresponding parts in FIG. 6 are designated by the same reference numerals and characters.

In FIG. 7, the semiconductor device comprises a semiinsulating GaAs substrate 31, an undoped (intrinsic) GaAs active layer 32, an n+-type AlGaAs electron supplying layer 33, a level shift diode region 34, an element isolation region 35, alloyed regions 36, a two dimensional electron gas (2DEG) layer 37, source electrodes SQ3 and SQ4, drain electrodes DQ3 and DQ4, gate electrodes GQ3 and GQ4, and a cathode electrode CD of the level shift diode D1. High electron mobility transistors (HEMTs) are used for the transistors Q3 and Q4.

Figure 8:
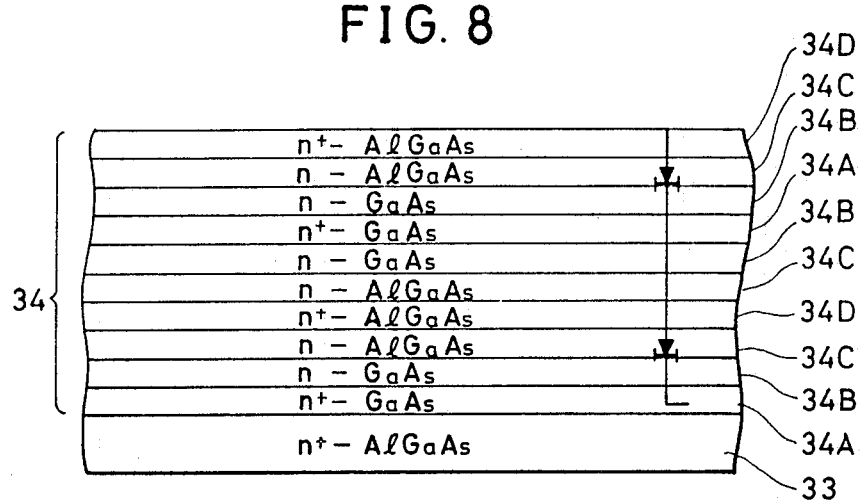
FIG. 8 is a cross sectional view on an enlarged scale showing an essential part of a level shift diode used in the first embodiment.

FIG. 8 shows on an enlarged scale the level shift diode region 34 shown in FIG. 7 together with the n+-type AlGaAs electron supplying layer 33. The level shift diode region 34 comprises an n+-type GaAs layer 34A, an n-type GaAs layer 34B, an n-type AlGaAs layer 34C, an n+-type AlGaAs layer 34D, an n-type AlGaAs layer 34C, an n-type GaAs layer 34B, an n+-type GaAs layer 34A, an n-type GaAs layer 34B, an n-type AlGaAs layer 34C, and an n+-type AlGaAs layer 34D. The n+-type AlGaAs electron supplying layer 33 and the level shift diode region 34 constitute the level shift diode D1 which is essentially the same as the level shift diode 20 described before in conjunction with FIGS. 4A through 4C and 5. Hence, the drain electrode DQ4, (FIG. 7) functions as the anode electrode of the level shift diode D1.

Since the level shift diode region 34 comprises highly doped layers, the level shift diode region 34 can also function satisfactorily as an electrode contact layer.

As may be seen from FIGS. 7 and 8, the level shift diode D1 is connected between the source electrode SQ3 of the transistor Q3 and the drain electrode DQ4 of the transistor Q4, and the semiconductor device shown in FIG. 7 is identical to the essential part of the BFL circuit indicated by the phantom lines in FIG. 6.

Figure 9:
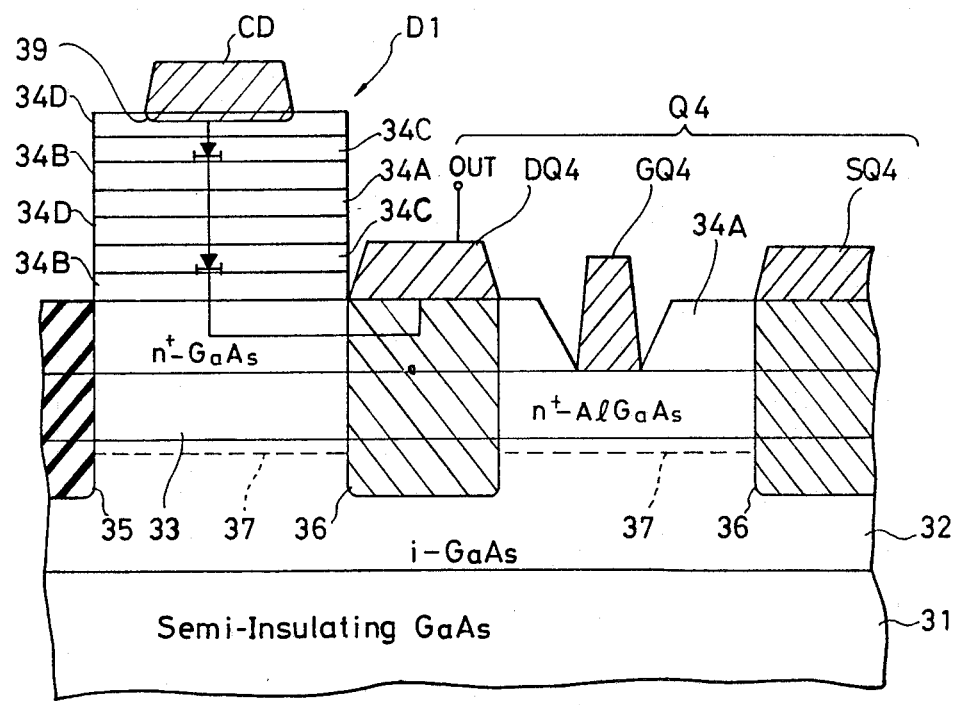
FIG. 9 is a cross sectional view showing an essential part of a modification of the first embodiment.

FIG. 9 shows an essential part of a modification of the first embodiment. In FIG. 9, those parts which are the same as those corresponding parts in FIGS. 7 and 8 are designated by the same reference numerals, and a description thereof will be omitted. One n-type GaAs layer 34B and one n-type AlGaAs layer 34C respectively in the middle are omitted from the level shift diode region 34 shown in FIG. 8. In addition, an alloyed region 39 is formed in the top n+-type AlGaAs layer 34D. As described before in conjunction with FIG. 4C, these omitted layers 34B and 34C have little effect and are omitted in this modification for this reason. The illustration of the connection between the cathode electrode CD and the source electrode SQ3 is omitted in FIG. 9.

In FIGS. 7 through 9 and FIGS. 11, 12, 14 and 15 which will be described later, the symbols of the diode and/or transistor are shown in the cross sectional view to facilitate the understanding thereof.

Figure 10:
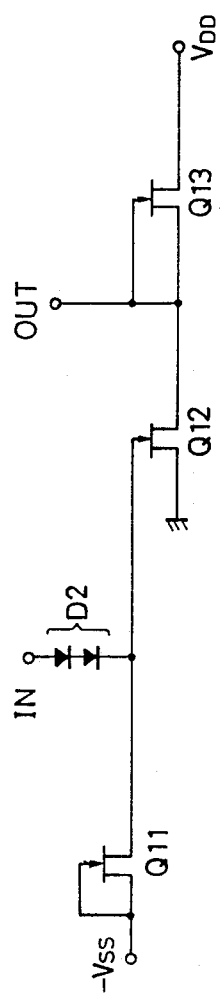
FIG. 10 is a circuit diagram showing a second embodiment of the semiconductor device according to the present invention.

Next, a description will be given on a second embodiment of the semiconductor device according to the present invention. FIG. 10 is a circuit diagram of the second embodiment. In FIG. 10, the semiconductor device is a Schottky diode field effect transistor logic (SDFL) circuit comprising transistors Q11 through Q13 and a level shift diode D2. IN and OUT respectively denote input and output terminals, $V_{DD}$ denotes a positive power source voltage, and $-V_{SS}$ denotes a negative power source voltage.

Figure 11:
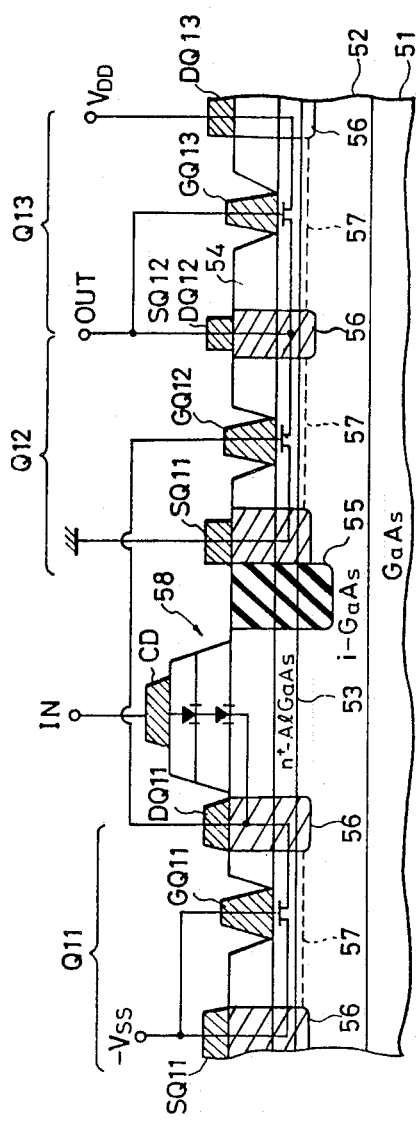
FIG. 11 is a cross sectional view showing an essential part of the second embodiment.

FIG. 11 shows an essential part of the second embodiment. In FIG. 11, those parts which are the same as those corresponding parts in FIG. 10 are designated by the same reference numerals and characters.

In FIG. 11, the semiconductor device comprises a semi-insulating GaAs substrate 51, an undoped (intrinsic) GaAs active layer 52, an n+-type AlGaAs electron supplying layer 53, a GaAs layer 54, an element isolation region 55, alloyed regions 56, a two dimensional electron gas (2DEG) layer 57, a level shift diode region 58, source electrodes SQ11, SQ12 and SQ13, drain electrodes DQ11, DQ12 and DQ13, gate electrodes GQ11, GQ12 and GQ13, and a cathode electrode CD of the level shift diode D2. HEMTs are used for the transistors Q11 through Q13.

Figure 12:
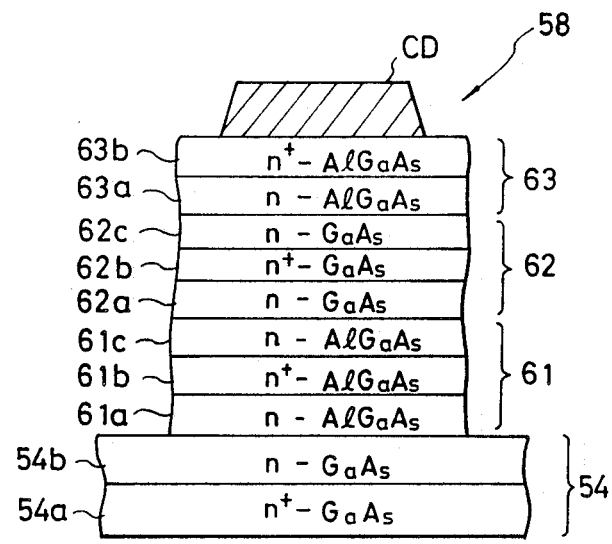
FIG. 12 is a cross sectional view on an enlarged scale showing a level diode region of the second embodiment.

As shown in FIG. 12, the GaAs layer 54 is made up of an n+-type GaAs layer 54a and an n-type GaAs layer 54b. The level shift diode region 58 comprises an AlGaAs layer 61, an GaAs layer 62 and an AlGaAs layer 63. The AlGaAs layer 61 comprises an n-type AlGaAs layer 61a, an n+-type AlGaAs layer 61b and an n-type AlGaAs layer 61c. The GaAs layer 62 comprises an n-type GaAs layer 62a, an n+-type GaAs layer 62b and an n-type GaAs layer 62c. The AlGaAs layer 63 comprises an n-type-AlGaAs layer 63a and an n+-type AlGaAs layer 63b.

As may be seen from FIGS. 10 and 11, the level shift diode D2 is connected between the cathode electrode CD and the drain electrode DQ11 of the transistor Q11, and the semiconductor device shown in FIG. 11 is identical to the SDFL circuit shown in FIG. 10.

Figure 13:
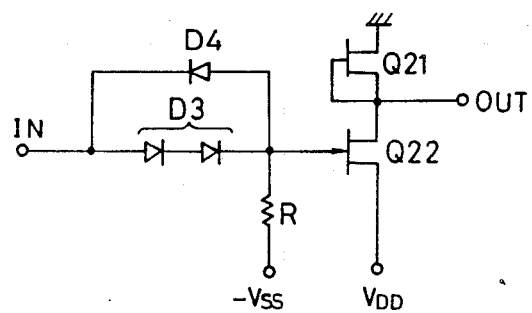
FIG. 13 is a circuit diagram showing a third embodiment of the semiconductor device according to the present invention.

Next, a description will be given on a third embodiment of the semiconductor device according to the present invention. FIG. 13 is a circuit diagram of the third embodiment. In FIG. 13, the semiconductor device is a field effect transistor logic with Schottky diode and coupling capacitor (FLSC) circuit comprising transistors Q21 and Q22, level shift diodes D3 and D4 and a resistor R. IN and OUT respectively denote input and output terminals, $V_{DD}$ denotes a positive power source voltage, and $-V_{SS}$ denotes a negative power source voltage.

Figure 14:
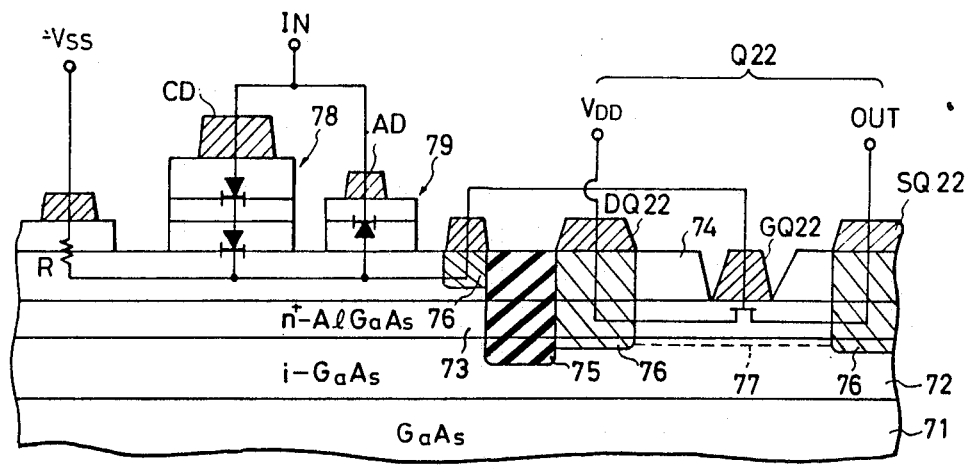
FIG. 14 is a cross sectional view showing an essential part of the third embodiment.

FIG. 14 shows an essential part of the third embodiment. In FIG. 14, those parts which are the same as those corresponding parts in FIG. 13 are designated by the same reference numerals and characters.

In FIG. 14, the semiconductor device comprises a semi-insulating GaAs substrate 71, an undoped GaAs active layer 72, an n+-type AlGaAs electron supplying layer 73, a GaAs layer 74, an element isolation region 75, alloyed regions 76, a two dimensional electron gas (2 DEG) layer 77, level shift diode regions 78 and 79, a source electrode SQ22, a drain electrode DQ22, a gate electrode GQ22, an anode electrode AD of the level shift diode D4, and a cathode electrode CD of the level shift diode D3. HEMTs are used for the transistors Q21 and Q22.

Figure 15:
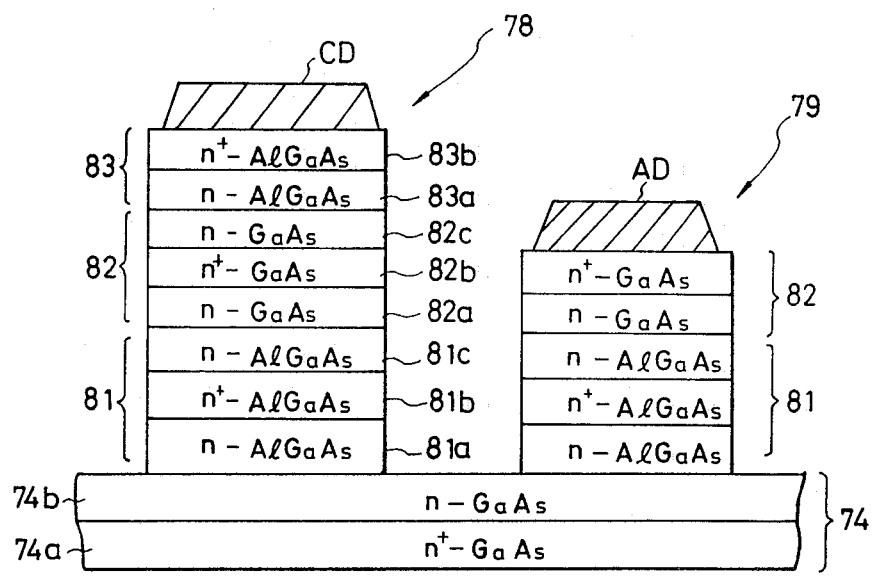
FIG. 15 is a cross sectional view on an enlarged scale showing level diode regions of the third embodiment.

As shown in FIG. 15, the GaAs layer 74 is made up of an n+-type GaAs layer 74a and n-type GaAs layer 74b. The level shift diode region 78 comprises an AlGaAs layer 81, a GaAs layer 82 and an AlGaAs layer 83. The level shift diode region 79 comprises the AlGaAs layer 81 and the GaAs layer 82. The AlGaAs layer 81 comprises an n-type AlGaAs layer 81a, an n+-type AlGaAs layer 81b and an n-type AlGaAs layer 81c. The GaAs layer 82 comprises an n-type GaAs layer 82a, an n+-type GaAs layer 82b and an n-type GaAs layer 82c. The AlGaAs layer 83 comprises an n-type AlGaAs layer 83a and an n+-type AlGaAs layer 83b.

Figure 16:
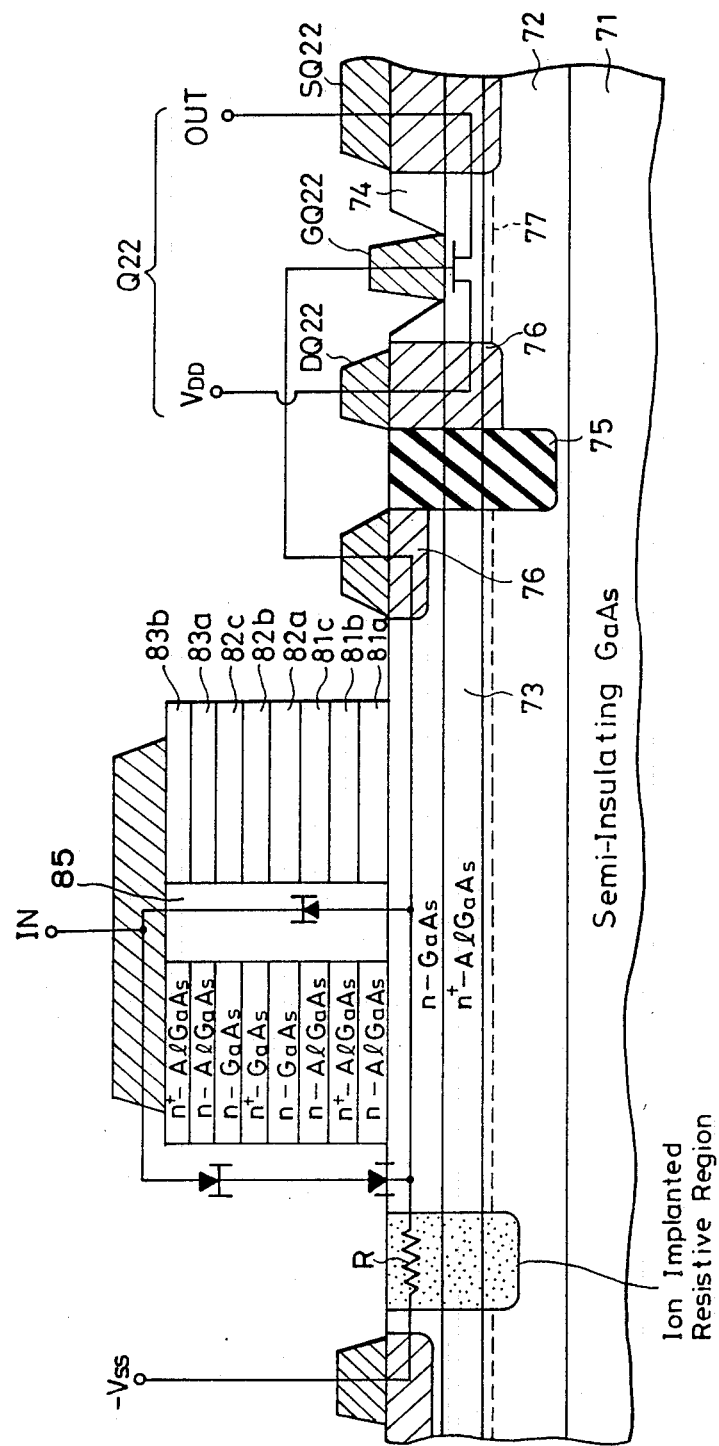
FIG. 16 is another cross sectional view showing an essential part of the third embodiment.

FIG. 16 shows another cross sectional view of the third embodiment. FIG. 16 shows almost the same structure as FIGS. 14 and 15. The only difference is that the level shift diode at the right hand side has the layers 82c, 83a and 83b. Therefore, in FIG. 16, two level shift diodes have the same semiconductor layers construction but operate differently depending on the applied voltage.

As may be seen from FIGS. 13 and 14, the level shift diodes D3 and D4 are connected in parallel, and the semiconductor device shown in FIG. 13 is identical to the essential part of the FLSC circuit shown in FIG. 14.

According to the embodiments, it may be seen that the level shift quantity of the level shift diode in the semiconductor device is accurately controlled to a desired value because the level shift diode utilizes the heterojunction. In addition, the level shift diode only occupies a small area on the semiconductor device compared to the conventional semiconductor using a Schottky diode. Moreover, after a plurality of the n+-type GaAs layer, the n-type GaAs layer, the n-type AlGaAs layer and the n+-type AlGaAs layer are stacked, it is possible to obtain a desired level shift quantity by eliminating a predetermined numbers of layers of the stacked level shift diodes.

Especially in the case of the third embodiment, it may be seen that after a plurality of the n+-type GaAs layer, the n-type GaAs layer, the n-type AlGaAs layer and the n+-type AlGaAs layer are stacked, it is possible to form a plurality of level shift diodes on the same substrate by isolating level shift diode regions with an isolation area 85 and removing a predetermined number of layers from arbitrary ones of the level shift diode regions. In this manner, it is possible to form level shift diodes coupled in opposite directions on the same substrate, by simply making the number of layers of the level shift diode regions different from each other.

In the described embodiments shown in FIGS. 7–16, it is assumed for convenience' sake that the level shift diode at least comprises a first layer made of a first compound semiconductor and a second layer made of a second compound semiconductor having an electron affinity smaller than that of the first compound semiconductor, where the first and second compound semiconductors are both made of n-type semiconductors. However, the first and second compound semiconductors may both be made of either one of n-type and i-type semiconductors. Moreover, the first and second compound semiconductors may both be made of either one of p-type and i-type semiconductors. It will be readily apparent to those skilled in the art that the described embodiments shown from FIG. 7 and on may be modified to suit the case where the first and second compound semiconductors are both made of either one of p-type and i-type semiconductors, for example.

Further, the present invention is not limited to these embodiments, but various variations and modifications may be made without departing from the scope of the invention.

What is claimed is:

1. A diode having a stacked structure, comprising:
   a first layer of a first compound semiconductor having a first electron affinity;
   a second layer of a second compound semiconductor formed on said first layer and having a second electron affinity less than said first electron affinity, forming a first heterojunction between said first and second layers, said first and second compound semiconductors both comprising one of n-type and i-type semiconductor material;
   a third layer comprising said first compound semiconductor with the first electron affinity and formed on said second layer, forming a second heterojunction between said second and third layers;
   a first electrode formed on said first layer; and
   a second electrode formed on said third layer, said first, second and third layers forming a bi-directional diode between said first and second electrodes.

2. A diode as claimed in claim 1, wherein said diode provides a predetermined level shift quantity dependent upon said second compound semiconductor.

3. A diode as claimed in claim 1, wherein said first compound semiconductor comprises gallium arsenide (GaAs) and said second compound semiconductor comprises aluminum gallium arsenide (AlGaAs).

4. A diode as claimed in claim 1, wherein said first compound semiconductor comprises gallium arsenic (GaAs), and said second compound semiconductor comprises aluminum gallium arsenide ($Al_xGa_{1-x}As$), and said diode has a level shift quantity determined by aluminum content x.

5. A diode having a stacked structure, comprising:
   a first layer of a first compound semiconductor having a first electron affinity;

a second layer of a second compound semiconductor formed on said first layer and having a second electron affinity less than said first electron affinity, forming a first heterojunction between said first and second layers, said first and second compound semiconductors both comprising one of n-type and i-type semiconductor material;

a third layer comprising said first compound semiconductor with the first electron affinity and formed on said second layer, forming a second heterojunction between said second and third layers;

a fourth layer comprising said second compound semiconductor with the second electron affinity and formed on said third layer, forming a third heterojunction between said third and fourth layers;

a first electrode formed on said first layer; and a second electrode formed on said fourth layer, said first, second, third and fourth layers forming at least one bidirectional diode between said first and second electrodes.

6. A diode as claimed in claim 5, wherein a composition of said second compound semiconductor is selected to provide said diode with a predetermined level shift quantity.

7. A diode as claimed in claim 5, wherein said first compound semiconductor comprises gallium arsenide (GaAs) and said second compound semiconductor comprises aluminum gallium arsenide (AlGaAs).

8. A diode as claimed in claim 5, wherein said first compound semiconductor comprises gallium arsenide (GaAs) and said second compound semiconductor comprises aluminum gallium arsenide ($Al_xGa_{l-x}As$), and said diode has a level shift quantity determined by aluminum content x.

9. A bi-directional diode, comprising: a first stack structure formed on a substrate, including a first layer of a first compound semiconductor having a first electron affinity;

a second layer of a second compound semiconductor formed on said first layer and having a second electron affinity less than said first electron affinity, forming a first heterojunction between said first and second layers, said first and second compound semiconductors both comprising one of n-type and i-type semiconductor material; and a third layer comprising said first compound semiconductor with the first electron affinity and formed on said second layer, forming a second heterojunction between said second and third layers;

a second stack structure formed on the substrate adjacent to said first stack structure, including a fourth layer of said first compound semiconductor having the first electron affinity;

a fifth layer of said second compound semiconductor formed on said fourth layer and having the second electron affinity, forming a third heterojunction between said fourth and fifth layers; and a sixth layer comprising said first compound semiconductor with the first electron affinity and formed on said fifth layer, forming a fourth heterojunction between said fifth and sixth layers; and isolation means for providing isolation between said first and second adjacent stack structures.

10. A bi-directional diode as claimed in claim 9, wherein said first adjacent stack structure further includes a seventh layer comprising said second compound semiconductor with the second election affinity and formed on said third layer, forming a fifth heterojunction between said third and seventh layers.

11. A bi-directional diode as claimed in claim 10, wherein said second adjacent stack structure further includes an eight layer comprising said second compound semiconductor with the second electron affinity and formed on said sixth layer, forming a sixth heterojunction between said sixth and eighth layers of said second adjacent stack structure.

12. A bi-directional diode, comprising:

a first stack structure formed on a substrate, including:

a first layer of a first compound semiconductor having a first electron affinity;

a second layer of a second compound semiconductor formed on said first layer and having a second electron affinity less than said first electron affinity, forming a first heterojunction between said first and second layers, said first and second compound semiconductors both comprising p-type semiconductor material; and a third layer comprising said first compound semiconductor with the first electron affinity and formed on said second layer, forming a second heterojunction between said second and third layers;

a second stack structure formed on the substrate adjacent to said first stack structure, including a fourth layer of said first compound semiconductor having the first electron affinity;

a fifth layer of said second compound semiconductor formed on said fourth layer and having the second electron affinity, forming a third heterojunction between said fourth and fifth layers; and a sixth layer comprising said first compound semiconductor with the first electron affinity and formed on said fifth layer, forming a fourth heterojunction between said fifth and sixth layers a second stack structure formed on the substrate adjacent to said first stack structure, including a fourth layer of said first compound semiconductor having the first electron affinity;

a fifth layer of said second compound semiconductor formed on said fourth layer and having the second electron affinity, forming a third heterojunction between said fourth and fifth layers; and a sixth layer comprising said first compound semiconductor with the first electron affinity and formed on said fifth layer, forming a fourth heterojunction between said fifth and sixth layers; and isolation means for providing isolation between said first and second adjacent stack structures.

13. A bi-directional diode as claimed in claim 12, wherein said first adjacent stack structure further includes a seventh layer comprising said second compound semiconductor with the second electron affinity and formed on said third layer, forming a fifth heterojunction between said third and seventh layers.

14. A bi-directional diode as claimed in claim 13, wherein said second adjacent stack structure further includes an eighth layer comprising said second compound semiconductor with the second electron affinity and formed on said sixth layer, forming a sixth heterojunction between said sixth and eighth layers of said second adjacent stack structure.

* * * * *